United States Patent
Ong et al.

(10) Patent No.: US 8,799,598 B2
(45) Date of Patent: Aug. 5, 2014

(54) REDUNDANCY LOADING EFFICIENCY

(75) Inventors: Wei-Kent Ong, Penang (MY); Jih-Hong Beh, Penang (MY); Sei-Wei Henry Lau, Penang (MY); Oon-Poh Ang, Penang (MY)

(73) Assignee: Spansion LLC, Sunnyvale, CA (US)

( * ) Notice: Subject to any disclaimer, the term of this patent is extended or adjusted under 35 U.S.C. 154(b) by 300 days.

(21) Appl. No.: 13/399,537

(22) Filed: Feb. 17, 2012

(65) Prior Publication Data

US 2013/0219137 A1    Aug. 22, 2013

(51) Int. Cl.
*G06F 12/04* (2006.01)
*G06F 12/14* (2006.01)
*G06F 11/20* (2006.01)
*G06F 12/16* (2006.01)

(52) U.S. Cl.
CPC ........ *G06F 12/1441* (2013.01); *G06F 11/2094* (2013.01); *G06F 12/16* (2013.01)
USPC ................... 711/162; 709/215; 711/E12.103; 714/770; 714/710

(58) Field of Classification Search
CPC ..... G06F 12/16; G06F 12/04; G06F 11/2094; G06F 12/1441; G11B 20/1803
USPC ........... 711/162, E12.103; 709/215; 714/770, 714/710
See application file for complete search history.

(56) References Cited

U.S. PATENT DOCUMENTS

| | | |
|---|---|---|
| 5,572,466 A | 11/1996 | Sukegawa |
| 5,974,544 A | 10/1999 | Jeffries et al. |
| 6,154,850 A * | 11/2000 | Idleman et al. ............. 714/5.11 |
| 6,266,273 B1 | 7/2001 | Conley et al. |
| 6,301,152 B1 | 10/2001 | Campardo et al. |
| 6,385,674 B1 * | 5/2002 | Gajjar et al. .................. 714/770 |
| 6,393,552 B1 | 5/2002 | Eickemeyer et al. |
| 7,966,532 B2 * | 6/2011 | Bottelli et al. ................ 714/723 |
| 8,495,454 B2 * | 7/2013 | Yang ............................. 714/755 |
| 2002/0184259 A1 * | 12/2002 | Akishita et al. ............ 707/501.1 |
| 2010/0070686 A1 * | 3/2010 | Mergler et al. ............... 711/103 |
| 2013/0290618 A1 * | 10/2013 | Werner et al. ................ 711/103 |

* cited by examiner

*Primary Examiner* — Pierre-Michel Bataille

(57) ABSTRACT

A system comprising a processor and a memory, wherein said memory comprises instructions that when executed by said processor implement a method. The method includes loading a first portion of a set of redundancy data into a register of the processor for each redundant sector of a plurality of redundant sectors. A second portion of a set of redundancy data is also loaded into the volatile memory for each redundant sector of the plurality of redundant sectors. Loading the second portions of the sets of redundancy data comprises loading a third portion of redundancy data comprising a plurality of second portions of redundancy data for the plurality of redundant sectors.

31 Claims, 5 Drawing Sheets

FIGURE 2 (PRIOR ART)

| | | | | | | | | | | | | | | | | # of Redundancy bits | Density |
|---|---|---|---|---|---|---|---|---|---|---|---|---|---|---|---|---|---|
| High byte | | | | | | | Low byte | | | | | | | | | | |
| | | | | | | 8 | 7 | 6 | 5 | 4 | 3 | 2 | 1 | 0 | | 9 | 256Mb |
| | | | | | 9 | 8 | 7 | 6 | 5 | 4 | 3 | 2 | 1 | 0 | | 10 | 512Mb |
| | | | | 10 | 9 | 8 | 7 | 6 | 5 | 4 | 3 | 2 | 1 | 0 | | 10 | 1Gb |
| | | | 11 | 10 | 9 | 8 | 7 | 6 | 5 | 4 | 3 | 2 | 1 | 0 | | 12 | 2Gb |
| | | 12 | 11 | 10 | 9 | 8 | 7 | 6 | 5 | 4 | 3 | 2 | 1 | 0 | | 13 | 4Gb |
| | 13 | 12 | 11 | 10 | 9 | 8 | 7 | 6 | 5 | 4 | 3 | 2 | 1 | 0 | | 14 | 8Gb |
| 14 | 13 | 12 | 11 | 10 | 9 | 8 | 7 | 6 | 5 | 4 | 3 | 2 | 1 | 0 | | 15 | 16Gb |

All bit 8's are grouped into a single byte.

With this method, only 9 bytes are required to be loaded.

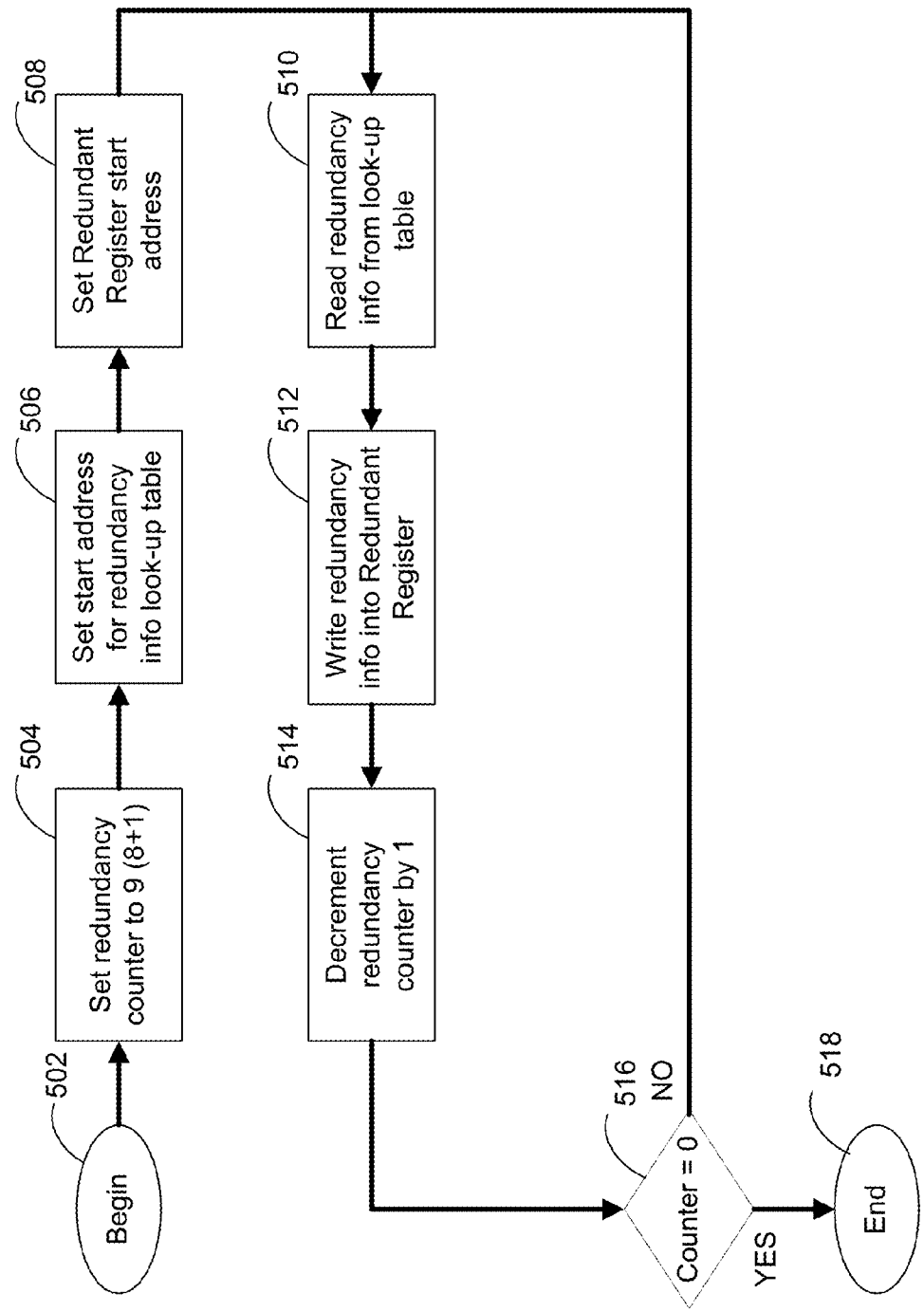

REDUNDANCY LOADING EFFICIENCY

TECHNICAL FIELD

The present disclosure relates generally to power-on-read time requirements and more specifically to loading redundancy information during power-on-read times.

BACKGROUND

In certain applications, power-on-read (POR) time can be an important specification emphasized by customers. In one exemplary embodiment, when power is supplied to a memory device, the memory device goes through a series of initialization stages. During this POR time, power-on-read algorithms are performed. The POR algorithms can execute steps necessary to put the memory device (i.e., the flash memory's microcontroller, SRAM, and registers) into a state ready to receive commands, such as read/write and erase requests.

One component of the power-on-read time is the time required for loading redundancy information. Such information (which can take more than 10 percent of the total POR time) is used to keep track of redundant sectors. An exemplary memory device can be divided into sectors, with the total number of available sectors divided into normal operation sectors and redundant sectors. When a normal operation sector has been identified and flagged as bad, one of the redundant sectors can be used in the place of the bad sector. In one exemplary embodiment, a redundancy register can replace the address of the bad sector with the address of one of the redundant sectors. As discussed in detail below, a flash memory device can contain a plurality of normal sectors, a plurality of redundant sectors and a look-up table storing the redundancy information that will contain information about the current usage of the redundant sectors (whether a particular redundant sector is currently being used to replace a bad normal sector).

Designing POR times to meet customer requirements has been getting more challenging, especially as flash memory devices are becoming more advanced and larger in terms of memory densities. For example, while an exemplary 256 Mb memory device has 8 redundant sectors, an exemplary 16 Gb memory device has 64 redundant sectors. Currently, there are two alternatives for speeding up POR times: pure hardware implementation and improved software efficiencies. There are at least three disadvantages to a pure hardware implementation. First, there is no flexibility. Once a particular hardware embodiment has been realized physically, there is no easy way to make modifications to it. Second, such modifications to the hardware will usually result in an increased die size. Creating new hardware embodiments that result in increased die size can also result in increased production costs. Third, pure hardware implementation can be more complicated than software implementations.

Therefore, software implementations are a preferred choice for power-on-read implementations when tight POR time requirements exist. However, software implementation has corresponding challenges and disadvantages of its own. For example, more than 10 percent of the actual power-on-read time can be spent in loading the redundancy information. In addition to the extended loading time concerns for redundancy information, larger memory devices require the loading and storage of ever larger quantities of redundancy information. With the available storage space also at a premium, especially in BiST loading schemes with additional memory requirements; software solutions for efficient redundancy information loading are sometimes not possible for larger memory devices. Such loading of redundancy information is inefficient and as discussed above, worsens with larger memory capacities. Therefore, it is desirable to improve the redundancy information loading to reduce the POR time.

SUMMARY OF THE INVENTION

This present invention provides a solution to the challenges inherent in loading redundancy information during power-on-read times. In a method according to one embodiment of the present invention, a method for loading redundancy information is disclosed. The method includes loading a first portion of a set of redundancy data for each redundant sector of a plurality of redundant sectors into a volatile memory. A second portion of a set of redundancy data is also loaded for each redundant sector of the plurality of redundant sectors into the volatile memory. Loading the second portion of the set of redundancy data for each redundant sector comprises loading a third portion of redundancy data comprising a plurality of second portions of redundancy data for a plurality of redundant sectors.

In a system according to one embodiment of the present invention, a system for loading redundancy information is disclosed. The system comprises a processor and a memory, wherein said memory comprises instructions that when executed by said processor implement a method. The method includes loading a first portion of a set of redundancy data for each redundant sector of a plurality of redundant sectors into a volatile memory. A second portion of a set of redundancy data is also loaded for each redundant sector of the plurality of redundant sectors into the volatile memory. Loading the second portion of the set of redundancy data for each redundant sector comprises loading a third portion of redundancy data comprising a plurality of second portions of redundancy data for a plurality of redundant sectors.

In a system according to one embodiment of the present invention, a system for loading redundancy information is disclosed. The system comprises a processor, a volatile memory, a nonvolatile memory, and a look-up table. Upon powering up the nonvolatile memory, redundancy data in the look-up table is loaded into the volatile memory. Loading the redundancy data comprises: loading a first portion of a set of redundancy data into the volatile memory for each redundant sector of a plurality of redundant sectors in the nonvolatile memory. A second portion of the set of redundancy data for each redundant sector of the plurality of redundant sectors is then loaded into the volatile memory. Loading the second portions of the sets of redundancy data comprises loading a third portion of redundancy data. The third portion of redundancy data comprises a plurality of second portions of redundancy data for the plurality of redundant sectors in the nonvolatile memory.

BRIEF DESCRIPTION OF THE DRAWINGS

The present invention will be better understood from a reading of the following detailed description, taken in conjunction with the accompanying drawing figures in which like reference characters designate like elements and in which:

FIG. 2 illustrates exemplary redundancy information bits arranged into two bytes for each redundant sector according to the prior art;

FIG. 5 illustrates an exemplary flow diagram of a method of loading redundancy information for each redundant sector of a memory device in accordance with an embodiment of the present invention.

DETAILED DESCRIPTION

Figure 1:
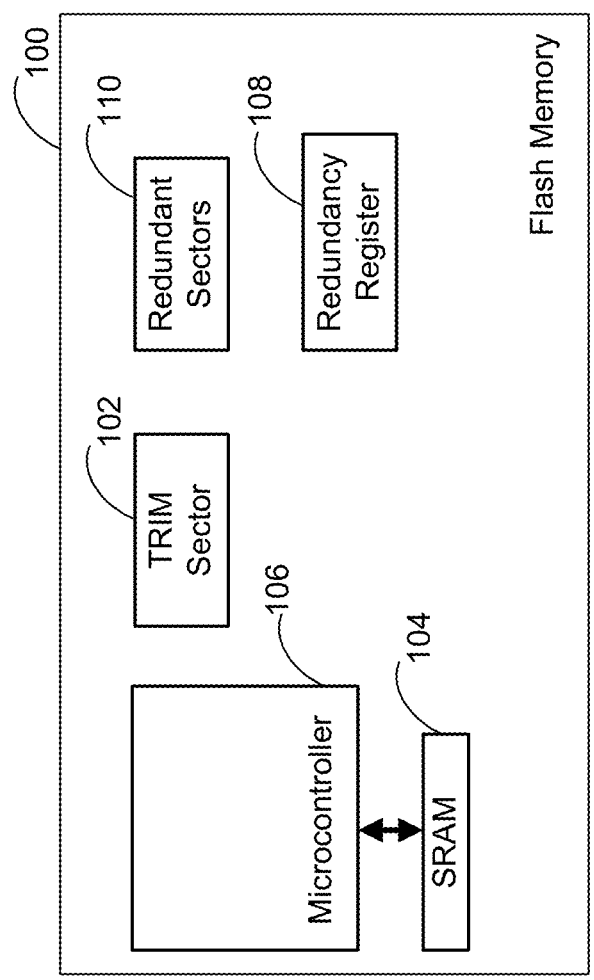
FIG. 1 illustrates an exemplary simplified block diagram of a microprocessor loading redundancy information from a look-up table into a static random access memory in accordance with an embodiment of the present invention.

Reference will now be made in detail to the preferred embodiments of the present invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of embodiments of the present invention, numerous specific details are set forth in order to provide a thorough understanding of the present invention. However, it will be recognized by one of ordinary skill in the art that the present invention may be practiced without these specific details. In other instances, well-known methods, procedures, components, and circuits have not been described in detail so as not to unnecessarily obscure aspects of the embodiments of the present invention. The drawings showing embodiments of the invention are semi-diagrammatic and not to scale and, particularly, some of the dimensions are for the clarity of presentation and are shown exaggerated in the drawing Figures. Similarly, although the views in the drawings for the ease of description generally show similar orientations, this depiction in the Figures is arbitrary for the most part. Generally, the invention can be operated in any orientation.

Notation and Nomenclature:

Some portions of the detailed descriptions, which follow, are presented in terms of procedures, steps, logic blocks, processing, and other symbolic representations of operations on data bits within a computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "processing" or "accessing" or "executing" or "storing" or "rendering" or the like, refer to the action and processes of a computer system, or similar electronic computing device, that manipulates and transforms data represented as physical (electronic) quantities within the computer system's registers and memories and other computer readable media into other data similarly represented as physical quantities within the computer system memories or registers or other such information storage, transmission or display devices. When a component appears in several embodiments, the use of the same reference numeral signifies that the component is the same component as illustrated in the original embodiment.

Embodiments of the present invention provide a solution to the increasing challenges inherent in maintaining short redundant information loading times with ever increasing memory device storage capacities. Furthermore, embodiments of the present invention also provide a solution to the increasing storage and loading requirements by reducing the quantity of data required to be loaded and stored for a given memory device. As discussed in detail below, various embodiments of the present disclosure provide a redundancy information loading scheme that divides the redundancy information bits for a particular redundant sector into a "low" portion and a "high" portion (in one embodiment, the low portion is one byte of data: a low byte, while the high portion is also one byte of data: a high byte. As also discussed in detail below, the high bytes of a plurality of redundant sectors can be combined into at least one combined high byte. In other embodiments, the low portion and high portion may be some other quantity of bits. As discussed in detail below, the redundancy information loading times can be shortened by loading a low byte for each redundant sector and at least one combined high byte comprising a plurality of high bytes for the redundant sectors. Such a loading scheme can result in a reduction in the quantity of redundancy data that must be loaded for a given memory device.

In one exemplary embodiment, as illustrated in FIG. 1, optimized redundancy information for the redundant sectors 110 can be stored in a TRIM sector 102 of a flash memory device 100. In one embodiment, the redundancy information in the TRIM sector 102 is stored as a look-up table. In one embodiment, redundancy information stored in the TRIM sector 102 has been optimized by the microcontroller 106. After optimizing the redundancy information temporarily stored in an SRAM 104, the optimized redundancy information can be transferred to the TRIM sector 102 for storage. As discussed below, during the performance of POR algorithms, the redundancy information stored in the TRIM sector 102 can be transferred to a redundancy register 108 in the flash memory 100. In one embodiment, the redundancy register 108 is a plurality of flip-flops. In one embodiment, after the redundancy information has been loaded into the redundancy register 108 during the POR algorithm, the loaded redundancy information can be easily and rapidly accessed whenever there is a read, write, or erase command. The flash memory device 100 can then check whether the targeted sector was repaired (e.g. replaced) by one of the redundant sectors found listed in the redundancy register and can redirect the command to the replacement redundant sector as needed.

As discussed above, and also illustrated in FIG. 1, flash memories can be implemented with microcontrollers 106 implementing software solutions to achieve flexibility. In an exemplary embodiment, an 8-bit microcontroller (MCU) can be used to achieve software flexibility, but with resulting slow POR times when compared to hardware solutions. As will be discussed in detail below, an 8-bit microcontroller will require the redundancy data to be loaded into the redundancy register 108 one byte (e.g. 8 bits) at a time.

Further, an exemplary 2 Gb memory device with 32 redundancy sectors has 32 sets of redundancy information, one set of 12 bits of redundancy data for each redundancy sector. In one embodiment, such as with an 8-bit microcontroller (MCU), the 12 bits can be split into 2 bytes. In one embodiment, the bytes of redundancy information are loaded one byte at a time. Hence during the loading of redundancy information for a 2 Gb memory device, a total of 64 bytes of data will need to be loaded for the 32 sets of redundancy information.

Table 1 below illustrates conventional redundancy information loading & POR times for different memory device densities that utilize an exemplary 8-bit microprocessor (MCU) 106. With an exemplary POR time specification of 300 μs, the conventional implementations will fail for 8 Gb density memory devices and onwards. As discussed above, because this exemplary embodiment makes use of an 8-bit microcontroller 106, the redundancy information can be divided into a low byte and a high byte. As illustrated in Table 1, with the redundancy information divided into two bytes for each redundant sector, an exemplary 256 Mb memory device according to the prior art will require the loading of 16 bytes of redundant information, while on the other extreme, a 16 Gb memory device will require the loading of 128 bytes of redundant information.

As also illustrated in Table 1, exemplary redundancy data loading times for 256 Mb memory devices to 16 Gb memory devices varies from 8.32 μs to 66.56 μs, respectively. Therefore, as also illustrated in Table 1, with the increase in redundancy loading times, 8 Gb memory devices and larger will fail an exemplary specification requirement of 300 μs. As discussed above, using conventional software solutions for loading redundancy information are not possible for 8 Gb memory devices and larger.

TABLE 1

| DENSITY | # of Redundant Sectors | # of bytes to be loaded | Redundant loading time | Total POR time (μs) |
| --- | --- | --- | --- | --- |
| 256 Mb | 8 | 16 | 8.32 | 250.04 |
| 512 Mb | 8 | 16 | 8.32 | 250.04 |
| 1 Gb | 16 | 32 | 16.64 | 258.36 |
| 2 Gb | 32 | 64 | 33.28 | 275.00 |
| 4 Gb | 32 | 64 | 33.28 | 275 |
| 8 Gb | 64 | 128 | 66.56 | 308.28 |
| 16 Gb | 64 | 128 | 66.56 | 308.28 |

As illustrated in FIG. 2, an exemplary 256 Mb memory device with 8 redundant sectors contains 9 bits of redundant information 202 for each redundant sector. An exemplary 512 Mb memory device, as illustrated in FIG. 2, with 8 redundant sectors contains 10 bits of redundant information 204 for each redundant sector. An exemplary 1 Gb memory device, as illustrated in FIG. 2, with 16 redundant sectors contains 11 bits of redundant information 206 for each redundant sector. As also illustrated in FIG. 2, an exemplary 2 Gb memory device contains 12 bits of redundant information 208 for each redundant sector, an exemplary 4 Gb memory device contains 13 bits of redundant information 210 for each redundant sector, an exemplary 8 Gb memory device contains 14 bits of redundant information 212 for each redundant sector, and an exemplary 16 Gb memory device contains 15 bits of redundant information 214 for each redundant sector.

Figure 3:
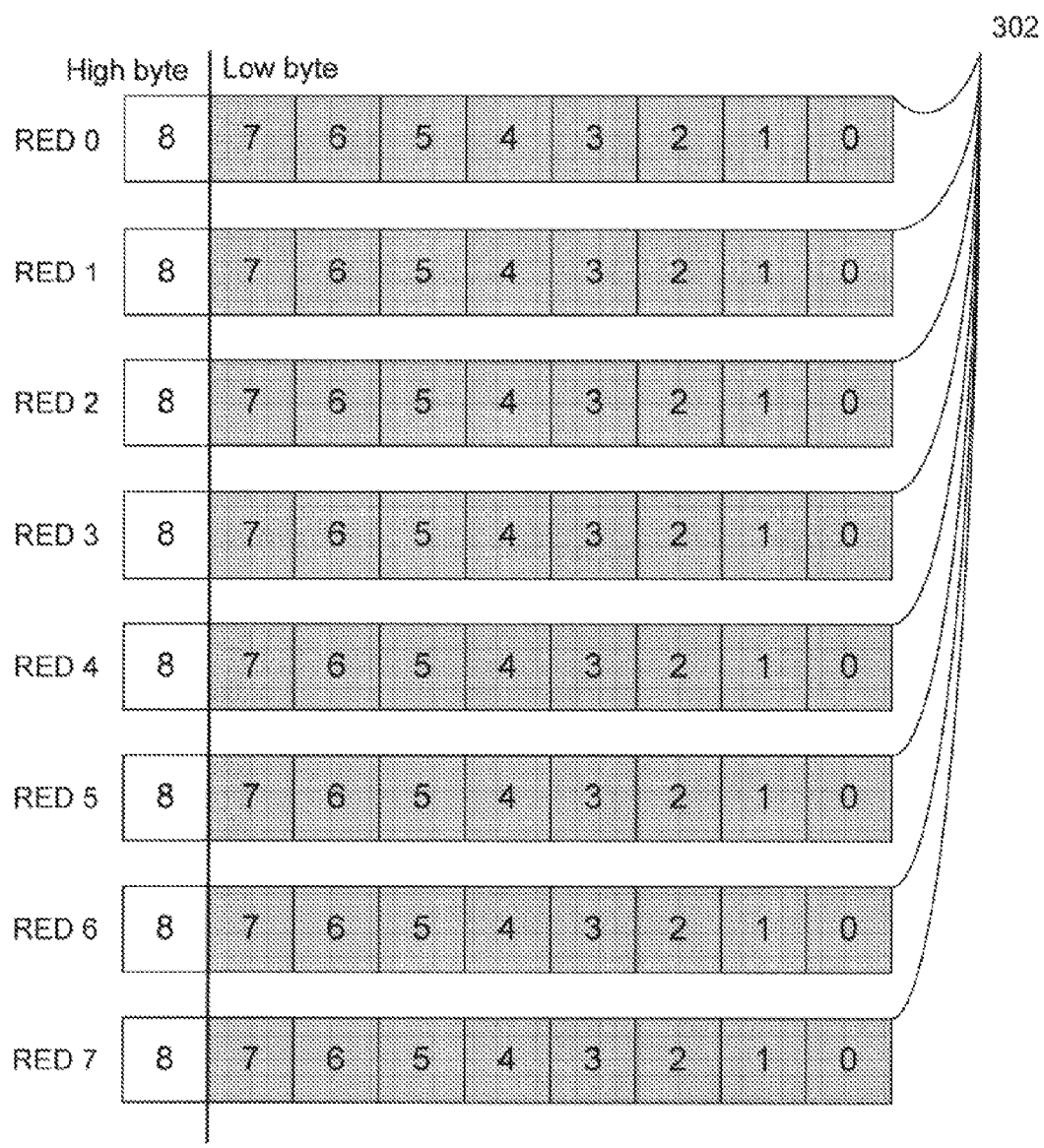
FIG. 3 illustrates exemplary redundancy information bits arranged into two bytes for each redundant sector of an exemplary 256 Mb memory device according to the prior art.

Improving Redundancy Loading Efficiencies:

In one exemplary embodiment, the POR time can be shortened by reducing the number of redundancy data bytes loading. For simplicity, the example of exemplary 256 Mb memory devices is illustrated. As illustrated in FIG. 3, an exemplary 256 Mb memory device requires 9 bits of redundancy information 302 for each redundancy sector (RED0-RED7) ($2^8$=256; 8 bit+1 enable bit=9 bits). The enable bit, which is bit 8, is stored in the high byte of each redundancy information, as the low byte is already filled. With this conventional scheme, during the POR time a total of 16 bytes of redundancy data are loaded (two bytes for each redundant sector).

Figure 4:
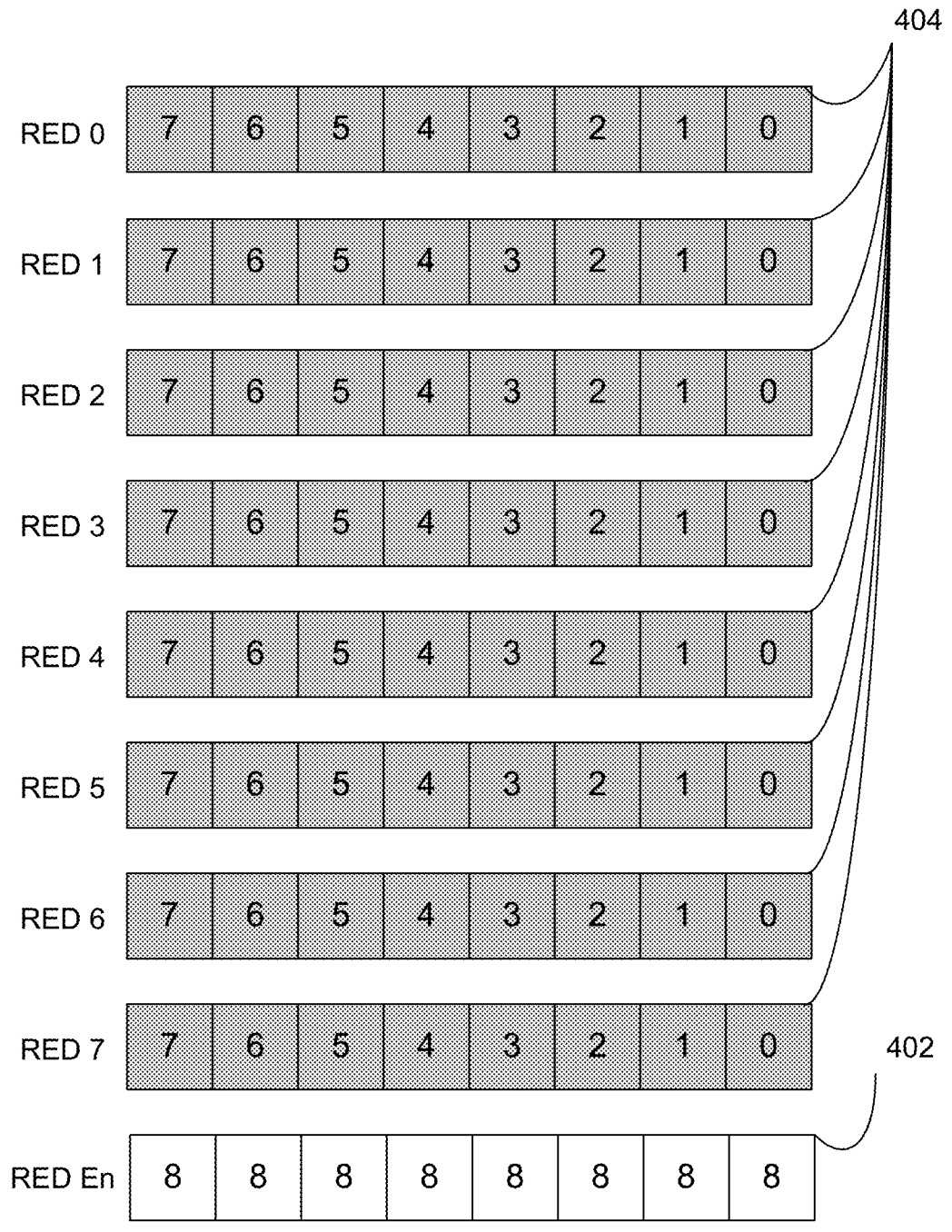
FIG. 4 illustrates exemplary redundancy information bits arranged into bytes for each redundant sector of an exemplary 256 Mb memory device in accordance with an embodiment of the present invention.

As illustrated in FIG. 4, all 8 enable bits (bit 8 of the high byte) can be grouped into a single byte 402. Therefore, in this exemplary embodiment, only 9 bytes are required to store the redundancy data for an exemplary 256 Mb memory device, instead of the conventional 16. As illustrated in FIG. 4, the exemplary 9 bytes of redundancy information comprise 8 low bytes 404, with one low byte for each redundant sector (RED0-RED7), while the remaining byte 402 contains the 8 enable bits (bit 8 of each high byte). Rather than loading 8 high bytes that contain in this example only a single bit each, the lone bits are grouped into a single combined high byte. This exemplary embodiment represents a possible reduction of 43.75% over the number of bytes required for the conventional redundancy information loading scheme.

Table 2 below illustrates a comparison of the calculated reductions achieved in different exemplary flash memory device densities through the use of the above described exemplary redundancy information loading methods.

TABLE 2

| | 256 Mb | 512 Mb | 1 Gb | 2 Gb | 4 Gb | 8 Gb | 16 Gb |
| --- | --- | --- | --- | --- | --- | --- | --- |
| Number of Redundancy Sectors | 8 | 8 | 16 | 32 | 32 | 64 | 64 |
| Original # of Redundancy bytes | 16 | 16 | 32 | 64 | 64 | 128 | 128 |
| New # of Redundancy bytes | 9 | 10 | 22 | 48 | 52 | 112 | 120 |
| Reduction | 43.75% | 37.50% | 31.25% | 25.00% | 18.75% | 12.46% | 6.23% |

While FIG. 4 illustrates the results of combining the contents of the high bytes for each redundant sector for an exemplary 256 Mb memory device, embodiments of the present invention can be applied to other memory devices as well. For example, in an exemplary 2 Gb memory device according to the present invention, the redundancy information stored in the look-up table 102 can comprise 32 low bytes and 16 combined high bytes for a total of 48 bytes, as illustrated in Table 2. As illustrated in FIG. 2, for an exemplary 2 Gb memory device, each redundancy sector comprises a low byte containing 8 bits and a high byte containing 4 bits. When the bits in the high bytes for the redundancy sectors are combined, they amount to the above described 16 combined high bytes. In a further example, illustrated in FIG. 2 and Table 2, in an exemplary 8 Gb memory device, comprising 64 redundancy sectors of 14 bits each, a total of 112 bytes can be loaded, a reduction of 16 bytes from the conventional redundancy loading scheme. For the above 8 Gb memory device, the 6 bits in each high byte can be combined into 48 combined high bytes, down from the conventional 64 high bytes.

An exemplary method for optimal redundancy information loading efficiency is illustrated in FIG. 5. In step 502 of FIG. 5, redundancy information loading is begun. In step 504 of FIG. 5, a redundancy counter is set. In an exemplary embodiment with 9 bytes of redundant information to be loaded, the redundancy counter is set to 9. In an exemplary embodiment for a 256 Mb memory device, as described above, 9 bits of redundant information for each redundant sector is loaded. The first 8 bits (in a low byte) are contained in the first 8 bytes, and the remaining bit 8 of the high byte for each redundant sector is contained in the ninth byte: a combined high byte. As described above, various memory device embodiments will require different numbers of bits of redundant information per redundant sector. While each memory device will comprise a full low byte for each redundancy sector, each redundancy sector will also comprise a high byte containing a varying number of bits. For example, an exemplary 256 Mb memory device contains 1 bit in each high byte, while an exemplary 8 Gb memory device contains 6 bits in each high byte. As discussed above, the bits in the high bytes can be combined into a reduced number of combined high bytes. Therefore, the total number of bytes required for loading redundancy information will be one low byte for each redundancy sector and a number of combined high bytes.

In step 506 of FIG. 5, the start address for a redundancy information look-up table is set. As discussed above, the look-up table can be in a TRIM sector 102 of the flash memory, as illustrated in FIG. 1. In step 508 of FIG. 5, a redundancy register 108 start address is also set. In one embodiment, the redundancy register 108 is implemented as a plurality of flip-flops. In step 510 of FIG. 5, redundancy information is read from the lookup table for the addressed redundancy information. In step 512 of FIG. 5, the redundancy information read in step 510 is written to the redundancy register 108. In step 514 of FIG. 5, the redundancy counter is decremented by 1. In step 516 of FIG. 5, the redundancy counter is read. If the counter reads 0, then the method moves on to step 518 of FIG. 5 and ends. If the redundancy counter reads a value greater than zero then the method returns to step 510 to read the next portion of redundancy information from the lookup table for the next addressed redundancy information.

While an 8-bit microcontroller has been utilized in the embodiments contained herein, other microcontroller can also be used. For example, a 16-bit microcontroller could also be used with different redundancy information loading criteria, as a 16-bit microcontroller could also have different sized registers as well. Therefore, the maximum data bandwidth for passing redundancy information from the TRIM sector 102 to the redundancy register 108 is a function of the capacity of the microcontroller utilized.

Although certain preferred embodiments and methods have been disclosed herein, it will be apparent from the foregoing disclosure to those skilled in the art that variations and modifications of such embodiments and methods may be made without departing from the spirit and scope of the invention. It is intended that the invention shall be limited only to the extent required by the appended claims and the rules and principles of applicable law.

What is claimed is:

1. A method comprising:
    loading a first portion of a set of redundancy data into a register of a microcontroller for each redundant sector of a plurality of redundant sectors, wherein the register is loaded with a plurality of first portions of sets of redundancy data, a first portion of a set of redundancy data for each redundant sector;
    loading a second portion of the set of redundancy data into the register for each redundant sector of the plurality of redundant sectors, wherein the register is loaded with a plurality of second portions of redundancy data, a second portion of the set of redundancy data for each redundant sector, wherein loading the second portions of the sets of redundancy data comprises loading a third portion of redundancy data comprising a plurality of second portions of redundancy data for the plurality of redundant sectors.

2. The method of claim 1, wherein a first portion of a set of redundancy data is a maximum number of bits as defined by a bandwidth of the microcontroller.

3. The method of claim 2, wherein a second portion of a set of redundancy data is a portion of the maximum number of bits as defined by the bandwidth of the microcontroller.

4. The method of claim 3, wherein the portion of the maximum number of bits is less than the maximum number of bits as defined by the bandwidth of the microcontroller.

5. The method of claim 2, wherein a third portion of redundancy data is a portion of the maximum number of bits as defined by a bandwidth of the microcontroller.

6. The method of claim 5, wherein the third portion of redundancy data is a maximum number of bits as defined by the bandwidth of the microcontroller.

7. The method of claim 5, wherein a third portion of redundancy data is a portion of a byte of redundancy data.

8. The method of claim 5, wherein a third portion of redundancy data is a byte of redundancy data.

9. The method of claim 8, wherein the third portion of redundancy data comprises a plurality of second portions of redundancy data.

10. The method of claim 1, wherein a first portion of a set of redundancy data is a byte of redundancy data.

11. The method of claim 10, wherein a second portion of a set of redundancy data is a portion of a byte of redundancy data.

12. The method of claim 11, wherein the portion of a byte of redundancy data is less than a byte of redundancy data.

13. A system comprising a processor and a memory, wherein said memory comprises instructions that when executed by said processor implement a method comprising:
    loading a first portion of a set of redundancy data into a register of the processor for each redundant sector of a plurality of redundant sectors, wherein the register is loaded with a plurality of first portions of sets of redundancy data, a first portion of a set of redundancy data for each redundant sector;
    loading a second portion of the set of redundancy data into the register for each redundant sector of the plurality of redundant sectors, wherein the register is loaded with a plurality of second portions of redundancy data, a second portion of the set of redundancy data for each redundant sector, wherein loading the second portions of the sets of redundancy data comprises loading a third portion of redundancy data comprising a plurality of second portions of redundancy data for the plurality of redundant sectors.

14. The system of claim 13, wherein a first portion of a set of redundancy data is a maximum number of bits as defined by a bandwidth of the processor.

15. The system of claim 14, wherein a second portion of a set of redundancy data is a portion of the maximum number of bits as defined by the bandwidth of the processor.

16. The system of claim 15, wherein the portion of the maximum number of bits is less than the maximum number of bits as defined by the bandwidth of the processor.

17. The system of claim 14, wherein a third portion of redundancy data is a portion of the maximum number of bits as defined by a bandwidth of the processor.

18. The system of claim 17, wherein the third portion of redundancy data is a maximum number of bits as defined by the bandwidth of the processor.

19. The system of claim 17, wherein a third portion of redundancy data is a portion of a byte of redundancy data.

20. The system of claim 17, wherein a third portion of redundancy data is a byte of redundancy data.

21. The system of claim 20, wherein the third portion of redundancy data comprises a plurality of second portions of redundancy data.

22. The system of claim 13, wherein a first portion of a set of redundancy data is a byte of redundancy data.

23. The system of claim 22, wherein a second portion of a set of redundancy data is a portion of a byte of redundancy data.

24. The system of claim 23, wherein the portion of a byte of redundancy data is less than a byte of redundancy data.

25. A system comprising:
   a processor comprising a register;
   a volatile memory;
   a nonvolatile memory; and
   a look-up table, wherein upon powering the nonvolatile memory, redundancy data in the look-up table is loaded into the register, wherein loading the redundancy data comprises:
      loading a first portion of a set of redundancy data into the volatile memory for each redundant sector of a plurality of redundant sectors in the nonvolatile memory, wherein the register is loaded with a plurality of first portions of sets of redundancy data, a first portion of a set of redundancy data for each redundant sector;
      loading a second portion of the set of redundancy data into the volatile memory for each redundant sector of the plurality of redundant sectors in the nonvolatile memory, wherein the register is loaded with a plurality of second portions of redundancy data, a second portion of the set of redundancy data for each redundant sector, wherein loading the second portions of the sets of redundancy data comprises loading a third portion of redundancy data comprising a plurality of second portions of redundancy data for the plurality of redundant sectors in the nonvolatile memory.

26. The system of claim 25, wherein a first portion of a set of redundancy data is a byte of redundancy data.

27. The system of claim 25, wherein a second portion of a set of redundancy data is a portion of a byte of redundancy data.

28. The system of claim 27, wherein the portion of a byte of redundancy data is less than a byte of redundancy data.

29. The system of claim 25, wherein a third portion of redundancy data is a portion of a byte of redundancy data.

30. The system of claim 29, wherein a third portion of redundancy data is a byte of redundancy data.

31. The system of claim 25, wherein the third portion of redundancy data comprises a plurality of second portions of redundancy data.

* * * * *